United States Patent [19]

Tsunoda et al.

[11] 4,154,614
[45] May 15, 1979

[54] PHOTOSENSITIVE DIAZO COMPOSITION WITH GRAFT COPOLYMER FOR USE IN PRINTING SCREEN

[75] Inventors: Takahiro Tsunoda, Funabashi; Sadayoshi Kaneda, Narashino; Shin Saito, Suita, all of Japan

[73] Assignee: Nippon Paint Co., Ltd., Osaka, Japan

[21] Appl. No.: 827,556

[22] Filed: Aug. 25, 1977

Related U.S. Application Data

[63] Continuation of Ser. No. 583,778, Jul. 2, 1975, abandoned.

[51] Int. Cl.² .......... G03C 1/54; G03C 1/60; G03C 1/76; G03F 7/12
[52] U.S. Cl. .......... 96/75; 96/36.4; 96/86 P; 96/91 R; 96/115 R; 96/67; 101/128.3
[58] Field of Search .......... 96/75, 36.4, 91 R, 86 P, 96/115 R, 67; 101/128.3

[56] References Cited

U.S. PATENT DOCUMENTS

| 3,100,150 | 8/1963 | Chismor et al. | 96/36.4 |
|---|---|---|---|
| 3,174,860 | 3/1965 | Sus et al. | 96/36.4 |
| 3,189,451 | 6/1965 | Reichel | 96/75 |
| 3,246,986 | 4/1966 | Borchers | 96/75 |
| 3,853,561 | 12/1974 | Reichel et al. | 96/75 |
| 3,867,147 | 2/1975 | Teuscher | 96/75 |
| 3,915,707 | 10/1975 | Gesswein et al. | 96/75 |
| 4,019,907 | 4/1977 | Tsunoda et al. | 96/115 R |

FOREIGN PATENT DOCUMENTS

| 45-21914 | 7/1970 | Japan | 96/36.4 |
|---|---|---|---|
| 46-35165 | 10/1971 | Japan | 96/36.4 |
| 47-17505 | 9/1972 | Japan | 96/75 |
| 48-19099 | 6/1973 | Japan | 96/75 |
| 50-83101 | 7/1975 | Japan | 101/128.3 |

OTHER PUBLICATIONS

Chemical Abstracts, vol. 80, 1974, #64997q.
Chemical Abstracts, vol. 70, 1969, #48150w.
Chemical Abstracts, vol. 64, 1966, #8471d-e-f.

*Primary Examiner*—Charles L. Bowers, Jr.
*Attorney, Agent, or Firm*—Hosier, Niro & Daleiden, Ltd.

[57] ABSTRACT

The photosensitive composition contains a water-soluble graft copolymer of a partially hydrolyzed polyvinyl acetate grafted with acrylonitrile and optionally another vinylic monomer, a polymeric emulsion and a diazo compound. This composition possesses high resistance to solvent, abrasion and moisture and a favorable water-dissolubility as well.

30 Claims, No Drawings

PHOTOSENSITIVE DIAZO COMPOSITION WITH GRAFT COPOLYMER FOR USE IN PRINTING SCREEN

This is a continuation of application Ser. No. 583,778, filed July 2, 1975, now abandoned.

The present invention relates to a photosensitive composition and a process for producing same. More particularly, it relates to a photosensitive composition comprising a water-soluble copolymeric material or graft copolymer prepared by the graft polymerization of acrylonitrile and optinally another vinylic monomer on a partially saponified or hydrolyzed polyvinyl acetate, a polymeric emulsion and a water-soluble diazo compound.

Generally, in printing or impressing paper or fabric by the screen printing process, a design or pattern or so forth to be printed is first formed on a screen of silk, nylon, a polyester or stainless steel wire supported by a wooden or metallic frame, by applying a colloidal photosensitive material to said screen to form a photosensitive layer which is, in turn, subjected to exposure to ultraviolet radiation through a positive having the identical design or pattern or so forth, and washing out the unexposed areas with water. The screen thus formed is then employed to produce a desired print on the paper fabric by placing it on a sheet of paper or fabric, applying a printing ink or paste to predetermined areas of the surface of the screen and applying pressure thereon whereby the printing material is forced to penetrate and pass through the net structure of the screen.

Heretofore, for this conventional screen printing process, polyvinyl alcohol-bichromate composition has widely been employed as a photosensitizer. However, the use of such composition has disadvantages in preparing a screen because a coating on the screen tends to be less resistant to moisture and lacking dimensional stability and, furthermore, the bichromate, when wasted without particular treatment, is nocuous to the human body. From the foregoing, there has been a great demand for developing a photosensitive composition of the type capable of alleviating the disadvantages of conventional photosensitive compositions.

Many attempts have heretofore been made to improve conventional photosensitive compositions while maintaining the advantages of conventional bichromate photosensitive compositions. For this purpose, the employment of diazo compounds as photosensitizers has been proposed. An example is illustrated of such a composition that is composed of 1 part of a condensate product of p-diazodiphenylamine and paraformaldehyde, 100 parts of a 15 percent aqueous solution of a partially saponified polyvinyl acetate (degree of saponification, 88 percent; average degree of polymerization, 1,400), 100 parts of a polymeric emulsion containing 50 percent vinyl acetate and 0.001 part of a defoaming agent. With similar compositions containing, however, different kinds of diazo ompounds instead of said diazo compound, some attempts have also been made to improve the stability on storage of such photosensitive compositions. These compositions, however, have disadvantages in requiring an increase in amounts of a partially hydrolyzed or saponified polyvinyl acetate (PVA) if maintaining their water-dissolubility or resistance to solvent for ink is necessary, thereby resulting in a decrease in strength of film and resolution of image and, moreover, leading to a decreased resistance to moisture which may cause to render the printing screen softened and sticky in the presence of moisture in the air.

Therefore, it is an object of the present invention to provide a photosensitive composition possessing a highly water-dissoluble property to develop an image or water-dissolubility and at the same time various remarkable properties without showing the disadvantages prevailing in conventional photosensitive compositions. Another object of the present invention is to provide a photosensitive composition with properties applicable to a printing screen superior to conventional dichromate photosensitizers. Another feature of the present invention is a process for preparing such a photosensitive composition. A further feature of the present invention is the use of such a photosensitive composition for purposes in preparing a printing screen. Other objects, features and advantages of the present invention will become apparent during the course of the description which follows and the appended claims.

As the result of extensive studies to provide a photosensitive composition which can maintain a high water-dissolubility and impart properties superior to those of conventional photosensitive compositions, it has now been found that a photosensitive composition comprising a water-soluble polymeric material or graft copolymer, a polymeric emulsion and a water-soluble diazo compound can provide satisfactory properties for use in preparing a printing screen for the screen printing process. In order to further provide this composition with favorable properties in the screen printing, when desired, it may be preferred to add thereto a variety of additives.

The photosensitive composition of the present invention can exhibit favorable properties such as resistance to abrasion, moisture and solvent as well as an excellent water-dissolubility. The photosensitive composition of the present invention has advantages from the point of view of preventing pollution because it does not use any heavy metal which may be a cause of water contamination or air pollution. Accordingly, the photosensitive composition having these favorable properties is particularly suited for purposes in preparing a printing design or pattern or the like on a printing screen.

The water-soluble copolymeric material or graft copolymer to be used as one component for the photosensitive composition of the present invention is a graft copolymer in which acrylonitrile and optionally another vinylic monomer are grafted on a partially hydrolyzed vinyl acetate backbone or trunk polymer. It is to be understood that a slight amount of a homopolymer of acrylonitrile may be present in said graft copolymer, but the presence of such a homopolymer in the graft copolymer does not impair the desired properties of the photosensitive composition of the present invention so that this is also encompassed within the scope of the present invention.

The graft copolymer of the present invention may be prepared from a partially hydrolyzed or saponified polyvinyl acetate and acrylonitrile and optionally another vinylic monomer by graft polymerization by radiation of light or application of heat in the presence of a catalyst.

The partially hydrolyzed or saponified polyvinyl acetate used as the trunk polymer may be prepared by hydrolyzing a conventional polyvinyl acetate in a known manner to a partially hydrolyzed polyvinyl acetate having a degree of hydrolyzation of from about 80 to 90 percent and a degree of polymerization of about 300 to 1,200. The partially hydrolyzed polyvinyl acetate may preferably be employed, as an aqueous solution, in an amount ranging from about 10 to 40, preferably from about 15 to 25, parts by weight with respect to 100 parts by weight of water.

The vinylic monomer to be optionally used with acrylonitrile in any monomer which contains one or more vinyl groups in its chain and may conventionally be employed for this purpose. Examples of said vinylic monomers include, for example, an acrylic or methacrylic ester monomer such as, for example, an alkyl acrylate or methacrylate, e.g., methyl acrylate, ethyl acrylate, methyl methacrylate, ethyl methacrylate or glycidyl methacrylate or the like, an unsaturated nitrile, e.g., methacrylonitrile or the like, an amide, e.g., acrylamide or the like. These vinylic monomers may be used in combination with acrylonitrile. Thus, in order to further improve the advantageous properties of the PVA-acrylonitrile graft copolymer, although they are satisfactory as such in all respects, it may be desired to use said vinylic monomer or monomers in combination with acrylonitrile. The vinylic monomer or monomers may be mixed in an amount of about 5 to 50, preferably from 10 to 30, parts by weight with respect to 100 parts by weight of acrylonitrile.

The copolymers which are disclosed in Japanese Pat. No. 573,466 (Japanese Patent Publication No. 28,725/1969 published on Nov. 25, 1969) may also be used as the water-soluble graft copolymer for this purpose. This patent discloses a class of graft copolymer in which a polyvinyl alcohol is grafted by a vinyl monomer such as, for example, acrylonitrile, ethyl acrylate or glycidyl methacrylate. In this case, for example, a 15 percent aqueous solution of a partially hydrolyzed polyvinyl alcohol having a degree of hydrolyzation of 86.5 to 89.0 mol percent is used in a weight ratio of the polyvinyl alcohol to the vinyl monomer of from about 1:02 to 1:1.7.

The graft polymerization of the polyvinyl acetate with one or more vinylic monomers may be effected in a liquid phase, preferably in a solution containing therein from about 10 to 50, preferably from about 20 to 30, percent of solids with respect to 100 parts by weight of the reaction system, said vinylic monomers being employed in an amount ranging from about 30 to 120, preferably from 40 to 70, parts by weight based on 100 parts by weight of the polyvinyl acetate and said solids comprising the PVA, the vinylic monomer and the catalyst. Where the graft polymerization is effected by irradiation of light, the reaction temperature may be from 20° to 60° C., preferably from 30° to 40° C. The graft copolymerization by application of heat may be carried out at a temperature ranging from 50° to 80° C., preferably from 60° to 75° C.

The catalyst to be employed for this purpose is any catalyst which may generally be used for graft copolymerization of a vinylic monomer on a polyvinyl acetate. The catalyst particularly useful for this purpose includes, for example, a radical polymerization catalyst such as diacetyl or ammonium persulfate. It may be employed in an amount of from about 0.5 to 5.0, preferably from about 1 to 2, parts by weight with respect to 100 parts by weight of the vinylic monomer used.

The water-soluble copolymeric material or graft copolymer illustrated hereinabove is then reacted with the diazo compound of the present invention, thereby functioning together as a photosensitizer. Thus, the diazo compound, when irradiated with light, is caused to decompose and consequently form a linkage with the water-soluble graft copolymer, thereby rendering the product only slightly soluble or insoluble in water. Although conventional mixtures of a polyvinyl acetate with a diazo compound is also generally converted, upon irradiation of light, to a product insoluble in water, this product tends to be so swollen in water in spite of its insolubility that it is said to be less satisfactory for use as a printing screen. On the other hand, a mixture of the graft copolymer with the diazo compound according to the present invention can provide a highly water-resistant film or coating because of its remarkably great insolubility.

The diazo compound to be used for the photosensitive composition of the present invention includes any compound having at least two diazo groups in its molecule. The diazo compound which may be easily mixed with and/or dissolved in the water-soluble graft copolymer and the polymeric emulsion are more preferred. For this purpose, a diazo resin prepared by condensation between para-diazodiphenylamine and paraformaldehyde as described in U.S. Pat. No. 2,063,631 is particularly useful. Thus, the amine which can form the diazo resin includes a diphenyl amine which may have an alkyl substitution, such as, for example, methyl or ethyl, an alkoxy substitution, such as, for example, methoxy or ethoxy, or a halogen substitution, such as, for example, chlorine; more specifically, paraaminodiphenylamine, for example, 4-amino-4'-methyldiphenylamine, 4-amino-4'-ethyldiphenylamine, 4-amino-4'-methoxyphenylamine, 4-amino-4'-chlorodiphenylamine or the like. The aldehyde may include an aliphatic aldehyde which may be substituted by a halogen atom, such as, for example, paraformaldehyde, acetaldehyde, proprionaldehyde, chloroacetaldehyde, trichloroacetaldehyde or n-butylaldehyde. Diazo resins which are modified to improve their stability on storage may also be employed for this purpose.

Diazo salts of bisphenol ester resins disclosed in U.S. Pat. No. 3,169,864 and diazo acrylamide resins disclosed in U.S. Pat. No. 3,174,860 may also be used as the diazo compound to be employed in the present invention. Moreover, tetrazo compounds which possess two diazo groups may be used for this purpose. Examples of such tetrazo compounds are:

| Chemical Structure | Nomenclature |
|---|---|
| ClN$_2$—⟨⟩—⟨⟩—N$_2$Cl ZnCl$_2$ | diphenyl-4,4'-tetrazonium chloride zinc chloride double salt |
| Cl, Cl; ClN$_2$—⟨⟩—⟨⟩—N$_2$Cl ZnCl$_2$ | 3,3'-dichlorodiphenyl-4,4'-tetrazonium chloride zinc chloride double salt |
| CH$_3$O, OCH$_3$; ClN$_2$—⟨⟩—⟨⟩—N$_2$Cl ZnCl$_2$ | 3,3'-dimethoxydiphenyl-4,4'-tetrazonium chloride zinc chloride double salt |
| CH$_3$, CH$_3$; ClN$_2$—⟨⟩—⟨⟩—N$_2$Cl ZnCl$_2$ | 3,3'-dimethyldiphenyl-4,4'-tetrazonium chloride zinc chloride double salt |
| C$_2$H$_5$, C$_2$H$_5$; ClN$_2$—⟨⟩—⟨⟩—N$_2$Cl ZnCl$_2$ | 3,3'-diethyldiphenyl-4,4'-tetrazonium chloride zinc chloride double salt |
| (CH$_3$O, OCH$_3$; N$_2$—⟨⟩—⟨⟩—N$_2$) SO$_4$ | 3,3'-dimethoxydiphenyl-4,4'-tetrazonium sulfate |

| Chemical Structure | Nomenclature |
| --- | --- |
| (CH₃—[ring]—[ring]—CH₃, N₂—, —N₂)₂ SO₄ | 3,3'-dimethyldiphenyl-4,4'-tetrazonium sulfate |
| (C₂H₅—[ring]—[ring]—C₂H₅, N₂—, —N₂)₂ SO₄ | 3,3'-diethyldiphenyl-4,4'-tetrazonium sulfate |

These diazo compounds to be used for the present invention may preferably be mixed in an amount of about 1 to 10 parts by weight with respect to 100 parts by weight of the dry solids of the photosensitive composition. It is not desirable to employ the diazo compounds beyond the upper limit because this may result in the formation of pores in the photosensitive layer during the course of light irradiation or in the decomposition of the diazo linkage during storage or may decrease its penetrativity of light or may not allow sufficient photo-cure on the areas exposed to light. The employment thereof below the lower limit may result in insufficient cure on the exposed areas of film, thereby providing the cured photosensitive layer with only insufficient properties needed for a printing screen.

Although a reaction product of said water-soluble graft copolymer with said diazo compound can provide satisfactory resistance to moisture upon irradiation of light, it is preferred to add thereto the polymeric emulsion whereby the resulting photosensitive composition may provide a film or coating with sufficient resistance to abrasion and flexibility as well as resistance to moisture.

The polymeric emulsion to be employed for this purpose is any emulsion-polymerized solution which have conventionally been employed as an emulsion paint. This emulsion is an emulsion of polymer with water so that it may be mixed with a water-soluble graft copolymer in an arbitrary concentration. The polymeric emulsions, when used without combination with the water-soluble graft copolymer, may lead to the formation of a dry water-insoluble layer in which the state of emulsion tends to be broken down. In this case, in order for a photosensitive composition to maintain its water-dissoluble property to develop an image, it is desired to add said polymeric emulsion aqueous solution to the water-soluble graft copolymer. It is preferred to use the polymeric emulsion in a suitable amount with respect to the water-soluble graft copolymer so as to provide favorable properties such as resistance to abrasion while maintaining its water-dissolubility. The polymeric emulsion may be mixed with the water-soluble graft copolymer, said polymeric emulsion containing preferably dry solids in an amount of about 40 to 60 percent and said water-soluble graft copolymer containing preferably from about 20 to 30 percent dry solids. When the water-soluble graft copolymer contains 25 percent dry solids, the polymeric emulsion as a 50 percent aqueous solution may preferably be added in an amount ranging from about 30 to 333 parts by weight per 100 parts by weight of the water-soluble graft copolymer.

The polymeric emulsion to be used as an emulsion paint may be any emulsion possessing a property capable of forming a film and includes, for example, a vinyl acetate resinous emulsion, an ethylene-vinyl acetate copolymeric resinous emulsion, a methacrylic ester-vinyl acetate copolymeric resinous emulsion, a styrene-butadiene copolymeric resinous emulsion and a methacrylic ester-butadiene copolymeric resinous emulsion. In addition thereto, any other polymeric emulsions such as, for example, a butyl rubber latex, a vinyl chloride-vinyl acetate copolymeric resinous emulsion or the like may also be employed for this purpose. Of those emulsions, the acrylic or methacrylic ester may be an ester of acrylic or methacrylic acid with an aliphatic, straight or branched chained, alkyl group such as methyl, ethyl, n-butyl, 2-ethylhexyl, n-tetradecyl, n-hexadecyl or the like. Among a variety of the emulsions described hereinabove, the vinyl acetate resinous emulsion, a copolymeric resinous emulsion of vinyl acetate or other monomers or a mixture of the former with the latter are preferred.

The photosensitive composition of the present invention may further contain appropriate additives such as a defoaming agent, a water-insoluble powder or a water-soluble dyestuff. The additives may serve as providing a photosensitive composition with various favorable properties in preparing a printing screen which otherwise may not be achieved. However, it should be noted that the photosensitive composition containing no such additives is a main embodiment of the present invention so that the scope of the present invention should not be construed as being limited to composition with one of these additives or a combination thereof.

The defoaming agent may be employed to prevent the formation of pores in the photosensitive layer during the coating operation that may be a cause of pinholes and to make it easy to mix all the components of the composition in a desired manner. Examples of the defoaming agent are an alcohol such as octyl alcohol, a water-dispersible silicone resin or tributyl phosphate. The amount of the defoaming agent is from 0.01 to 1.00 part by weight per 1,000 parts by weight of a mixture of the water-soluble graft copolymer and the polymeric emulsion.

The effect of the water-insoluble powder on the printing screen is to prevent shrinkage or variations in size or form upon the drying operation after a pattern or design to be printed is formed on the screen and at the same time to improve light penetrativity through the photosensitive layer coated on the screen whereby the photosensitive composition is to be well photo-cured or cross-linked to the full depth of the layer. The water-insoluble powder should have such a transparency that it does not impair the photo-curing or cross-linking and includes a powder which may show a transparency of 50 to 90 percent when employed in the composition. Examples of such powders are amorphous silicon dioxide ("Aerosil" registered trade name) and white carbon having an average particle size of 0.1 to 20 microns. The amount of the powder may be from 1.0 to 10.0 parts by weight with respect to 1,000 parts by weight of a mixture of the water-soluble graft copolymer and the polymeric emulsion.

The effect achieved by the use of the water-soluble dyestuff is to facilitate the checking of the quality of an image or pattern developed by washing off the unexposed areas of film with water and at the same time to prevent enlargement or inaccurate development or variations in size of a developed pattern due to diffused reflection. The water-soluble dyestuff includes, for example, C. I. basic violet I (C. I. Index 42535), C. I. basic red 12 (C. I. Index 48070), C. I. basic blue 1 (C. I. Index 42025), C. I. acid green 36 (C. I. Index 61595), C. I. acid blue 40 (C. I. Index 62125) or C. I. acid red 249 (C. I. Index 18134). This dyestuff may be added in an amount of 0.1 to 1.0 part by weight per 1,000 parts by weight of a mixture of the water-soluble graft copolymer and the polymeric emulsion.

The addition of these additives to the photosensitive composition comprising three main components may serve as enhancing favorable properties which said photosensitive composition can otherwise possess. Particularly, these additives serve to reduce a number of pores which may be formed in a coating upon irradiation of light.

The photosensitive composition of the present invention may be prepared in any conventional manner, for example, by mixing the graft copolymer with the polymeric emulsion and adding the diazo compound and, if necessary, the additives to a product. However, the order of addition is not critical and may be chosen depending upon the nature of components used.

It is preferred to prepare the photosensitive composition so as to possess a viscosity of about 1,500 to 25,000 centipoises at 25° C. because this may improve its workability at the coating operation or prevent the formation of pinholes or irregularities in layer thickness.

A printing screen may be prepared using the photosensitive composition of the present invention by coating it on a polyester, silk, nylon or steel screen having a thickness of from about 60 to 200 microns, supported by a wooden or metallic, e.g., aluminum, frame, with a bucket or any device for coating a photosensitive solution. The coated layer on the screen is then dried by flowing warm air having a temperature of about 30° to 50° C. When desired, a plurality of an additional series of the coating and drying operations may be repeated until a desired thickness of film is attained.

With the screen thus obtained, a printing screen may be prepared by placing thereon a positive carrying a desired design or pattern or the like to be printed, bringing the positive into intimate contact with the screen and exposing it to light from a high-pressure mercury lamp or a carbon arc lamp whereby the image identical to the design or pattern of the positive is copied and formed on the photosensitive layer on the screen. The resulting screen is then immersed in warm water having a temperature of 25° to 35° C. and then blowing the water to the screen to wash out the unexposed or photo-uncured areas with a sprayer such as a spray gun. The resulting printing screen is then dried for use in printing.

The printing screen thus obtained may be employed for various purposes ranging from a general use screen printing to a printing screen for manufacture of printed electrical circuit boards and precision machine parts and/or electrical parts as well as the screen impressing.

The following reference examples and examples will be given to further illustrate the embodiments and the effects of the photosensitive composition of the present invention. In the following reference examples and examples, part or parts are by weight unless otherwise noted.

Reference Examples A to D are given to illustrate the preparation of the water-soluble graft copolymer of the present invention.

Reference Example A

A solution of 1.4 parts of diacetyl in 142.5 parts of acrylonitrile was dispersed in a solution of 285 parts of a partially saponified or hydrolyzed polyvinyl acetate ("GOSENOL GL-05" registered trade mark of Nippon Gosei Kagaku Kogyo Kabushiki Kaisha; degree of saponification, 88 mol percent; average degree of polymerization, 500) in 1,215 parts of water while being stirred. The resulting dispersion was then polymerized while being stirred by exposing it to light at 40° C. for 180 minutes with a 1,800-liter internal radiation type photo-reactor equipped with a 100-W high-pressure mercury lamp to give a translucent resinous solution of a water-soluble graft copolymer having a viscosity of 6,700 c.p.s. at 25° C. and solids of 25.5 percent.

Reference Example B 180 parts of acrylonitrile was dispersed, with stirring, in a solution of 360 parts of the partially hydrolyzed polyvinyl acetate used in Reference Example A having, however, a degree of hydrolyzation of 82 mol percent in 1,620 parts of water. The resultant dispersion was then charged into a 3,000-liter reaction vessel equipped with a thermostat, and a solution of 3.2 parts of ammonium persulfate in 16.8 parts of water was added dropwise to said dispersion at 60° C. The resulting mixture was stirred for 30 minutes at the same temperature to give a semi-transparent resinous solution of a water-soluble graft copolymer having a viscosity of 35,000 c.p.s. at 25° C. and solids of 24.2 percent.

Reference Example C 180 parts of acrylonitrile and 36 parts of methyl acrylate were dispersed in a solution of 360 parts of a partially saponified polyvinyl acetate ("GOSENOL KM-11"—registered trade mark of Nippon Gosei Kagaku Kogyo Kabushiki Kaisha; degree of saponification, 82 mol percent; average degree of polymerization, 1,100) in 1,620 parts of water while being stirred. The resulting dispersion was charged into a 3,000-liter reaction vessel with a thermostat, and a solution of 3.2 parts of ammonium persulfate in 16.8 parts of water was added dropwise to said dispersion at 60° C. The mixture was then stirred for 30 minutes at the same temperature to give a semi-transparent resinous solution of a water-soluble graft copolymer having a viscosity of 28,000 c.p.s. at 25° C. and solids of 25.8 percent.

The following Reference Examples I to III are given to illustrate the preparation of the polymeric emulsion of the present invention.

Reference Example I

To a solution of 54 parts of a partially saponified polyvinyl acetate (degree of saponification, 88 mol percent; average degree of polymerization, 1,400) in 500 parts of water was added 431 parts of vinyl acetate and 15.1 parts of potassium persulfate. The resulting solution was heated at 60° to 90° C. with stirring in a reaction vessel equipped with a reflux condenser to give a white viscous, polymeric resinous emulsion having a viscosity of 50,000 c.p.s. at 25° C.

Reference Example II

To a solution of 7.5 parts of gelatin in 1,492 parts of water was added 7.5 parts of potassium persulfate. The resulting solution was charged into a reaction vessel equipped with a stirrer, a dropping funnel and an inlet for gas, and 50 parts of vinyl chloride was blown thereinto while 360 parts of vinyl acetate was added dropwise thereto. The mixture was then heated at 40° to 80° C. with stirring to give a milky white, water-soluble polymeric emulsion having a viscosity of 1,000 c.p.s. at 25° C.

Reference Example III

To a solution of 96 parts of sodium lauryl sulfate and 1.6 parts of ammonium persulfate in 840 parts of water was added 400 parts of ethyl acrylate and 400 parts of methyl acrylate to give a monomeric emulsion. 400 parts of the emulsion thus obtained was then charged into a reactor equipped with a reflux condenser and heated at 80° to 90° C. After the initiation of polymerization, the rest of the monomeric emulsion was gradually added thereto to give a white, highly viscous acqueous, polymeric emulsion.

The following examples are given to illustrate the composition of the present invention without, however, limiting the same thereto.

EXAMPLE 1

A solution of 0.9 part of a polycondensate of p-diazodiphenylamine with paraformaldehyde in 9 parts of water was mixed with a mixture of 45 parts of the water-soluble graft copolymer of Reference Example A and 45 parts of the polymeric emulsion of Reference Example I to give a photosensitive composition having a viscosity of 4,200 c.p.s. at 25° C.

EXAMPLE 2

The photosensitive composition has the following components:

| Components | Amounts |
|---|---|
| Water-soluble graft copolymer of Reference Example B | 45 parts |
| Polymeric emulsion of Reference Example I | 45 parts |
| Polycondensate of p-diazo-diphenylamine and paraformaldehyde | 0.9 part |
| Water | 9 parts |
| Octyl alcohol | 0.05 part |
| "Aerosil" (Water-insoluble powder) | 0.5 part |
| Brilliant Blue (Water-soluble dyestuff) | 0.3 part |

Table 1 will present the comparative properties of the photosensitive composition of Example 2 with a conventional photosensitive composition.

The test specimens were prepared as follows: Each of the photosensitive composition under test was coated on a polyester screen of 200 mesh and tension of 9 kg. with a bucket four times to give a coating having an average thickness of 90 microns, and the coated screen was air-dried for 30 minutes at 45° C. The coated screen to which a sheet of a testing pattern had been closely attached with a vacuum printing framing machine was subjected to exposure of light by irradiating with a 3-kilowatt ultra-high pressure mercury lamp for 4 minutes from a distance of 1 meter from the surface of the coating. The resulting screen was immersed in water having a temperature of 20° C. for 2 minutes and then washed with a water sprayed by a spray gun with a water pressure of 5 to 6 kg. per square centimeter and from a distance of 20 centimer. The screen was then dried for 30 minutes at 45° C.

The resulting printing screen was tested with respect to resistance to printing and moisture, and resolution. In the following examples, the testing was carried out in the following procedures. The test on resistance to printing was measured by rubbing the surface of a coating of test specimen with a polyurethane squeeze rubber having a squeezing width of 18 cm. and a load of 6 kilogram on 32 strokes per minute while the test specimen is immersed in a solvent for ink (30 parts by weight of toluene; 30 parts by weight of ethyl acetate; and 40 parts by weight of cyclohexane) and measured as a number of strokes of movement required for the breakage of the coating. The property of resolution was tested using a facsimile testing chart (No. 1 - R manufactured by Institute of Image Electronics Engineers of Japan) and determined as the quality of separating the lines adjacent to each other. The quality was expressed in millimeters required for resolution. The property of resistance to moisture was tested by immersing the test specimen in water for 3 hours at 30° C. and expressed as a percentage for the value obtained by dividing the increased weight with the original weight of the specimen under test.

The test results will be set forth in Table 1 in which the capital letter "A" under column "Composition" means the photosensitive composition of Example 2 and "B" thereunder means the conventional composition.

Table 1

| Composition | Resistance to printing | Resolution | Resistance to moisture |
|---|---|---|---|
| A | 21,000 | 0.1 | 40 |
| B | 14,000 | 0.2 | 55 |

EXAMPLE 3

The photosensitive composition of Example 2 was applied to a polyester screen (225 lines per inch; tension, 8 kg.) four times with a bucket and dried for 1 hour at 30° to 40° C. A testing chart (Facsimile Test Chart No. 1 - R manufactured by Institute Of Image Electronics Engineers of Japan) was placed on the surface of the photosensitive coating and brought into intimate contact therewith by a vacuum printing framing machine. The resulting product was irradiated by a 3-KW ultra-high pressure mercury lamp from a distance of 1 meter for 4 minutes and then immersed in warm water having a temperature of 25° C. for 4 minutes, thereby permitting the dissolution of a great amount of the unexposed or uncured areas of film. The rest of its uncured areas was then washed off by blowing water with a spray gun at a temperature of 20° C. and a water pressure of 6 kg. per square centimeter from a distance of 30 cm. from the surface of the coated layer. The product was air-dried for 30 minutes at 45° C.

The properties of the resulting printing screen was almost the same as those presented in Table 1 in item A uner column "Composition".

EXAMPLE 4

By following the process used in Example 1 and replacing the water-soluble graft copolymer used therein by those of Reference Example B and Reference Example C, respectively, the corresponding photosensitive compositions were obtained which were, in turn, used each to prepare a printing screen in the same manner as in Example 3.

Said printing screens were then tested in the same manner as described hereinabove and the test results will be set forth in Table 2 in which Composition "B" contains the graft copolymer of Reference Example B and Composition "C" contains that of Reference Example C.

Table 2

| Composition | Resistance to printing | Resolution | Resistance to moisture |
|---|---|---|---|
| B | 20,000 | 0.2 | 42 |
| C | 19,000 | 0.1 | 50 |

EXAMPLE 5

By replacing methyl acrylate employed in Reference Example C by the following vinylic monomer, the corresponding graft copolymer was prepared in the same manner as in Example 1. The graft copolymer was then used to prepare a printing screen in the procedure employed in Example 3.

The test results will be presented in Table 3 where vinylic monomer "A" means ethyl acrylate, "B" acrylamide, "C" glycidyl methacrylate, and "D" the monomer used in Example C.

Table 3

| Vinylic monomer | Resistance to printing | Resolution | Resistance to moisture |
|---|---|---|---|
| A | 19,000 | 0.1–0.15 | 45 |
| B | 19,500 | 0.3 | 55 |
| C | 18,500 | 0.2 | 40 |
| D | 19,000 | 0.1 | 50 |

EXAMPLE 6

The process used in Example 3 was repeated using the same procedure and reagents as employed therein except for using the partially hydrolyzed polyvinyl acetate having different degrees of hydrolyzation and/or polymerization as presented in Table 4 in place of that employed in Example 1, to prepare the corresponding water-soluble graft copolymer which was then used to produce a printing screen in the same manner as in Example 3.

The test results will be set forth in Table 4 in which the composition obtained in Example 1 is also presented in the last item.

Table 4

| Hyrolyzation | Polymerization | Resistance to printing | Resistance to moisture | Resolution |
|---|---|---|---|---|
| 82 | 300 | 19,000 | 50 | 0.2–0.25 |
| 82 | 1,100 | 21,000 | 43 | 0.2 |
| 88 | 300 | 20,000 | 52 | 0.2 |
| 88 | 500 | 22,000 | 45 | 0.1 |
| 88 | 1,100 | 22,000 | 40 | 0.2–0.25 |
| 82 | 500 | 20,000 | 42 | 0.2 |

EXAMPLE 7

By following the procedure employed in Example 1 and replacing the polymeric emulsion by a polymeric emulsion as presented in the following table, the photosensitive composition was prepared which was then employed to prepare a printing screen.

The test results will be presented in Table 5 in which Composition "A" contains a vinyl acetate-vinyl chloride copolymer resinous emulsion obtained in Reference Example II, Composition "B" an ethylene-vinyl acetate copolymer resinous emulsion ("Evadick EP-1", registered trade mark of Japan Reichhold Chemical, Inc.; 50% solids; viscosity, 8,000–15,000), Composition "C" a methyl methacrylate-vinyl acetate copolymer resinous emulsion ("Toa Bond 40H", registered trade mark of Toa Paint Co., Ltd.; 50% dry solids; viscosity, 12,000–14,000 at 25° C.), Composition "D" a styrene-butadiene copolymer resinous emulsion ("Nipol", registered trade mark of Nippon Zeon Co., Ltd.; 49% dry solids; viscosity, 100 c.p.s. at 25° C.), and Composition "E" an ethyl methacrylate-butadiene copolymer resinous emulsion ("Polylac", registered trade mark of Mitsui Toatsu Chemicals, Inc.; 40% dry solids; viscosity, 50 c.p.s. at 25° C.).

Table 5

| Composition | Resistance to printing | Resistance to moisture | Resolution | Dissolubility |
|---|---|---|---|---|
| A | 21,000 | 38 | 0.15 | 5 |
| B | 20,000 | 36 | 0.1 | 3 |
| C | 19,000 | 34 | 0.15–0.2 | (*) |
| D | 19,500 | 34 | 0.2 | (*) |
| E | 19,000 | 32 | 0.2 | (*) |

In the foregoing and subsequent tables, the dissolubility was determined as an elapse of time during which the unexposed areas are to be eliminated in warm water having a temperature of 25° C. which was expressed in minutes. The asterisk in the above table means no dissolution of the resulting photosensitive layer coated on the screen.

EXAMPLE 8

The photosensitive composition under test was prepared by following the procedure employed in Example 1 and using a mixture of the vinyl acetate resinous emulsion of Reference Example I with the same polymeric emulsion as employed in Example 7 in an amount of parts by weight per 100 parts by weight of the vinyl acetate resinous emulsion. The resulting composition was then used to prepare a printing screen which was tested in the same manner as above.

The test results will be set forth in Table 6. In the following table, the capital letters referred to therein correspond to those stated in Example 7, respectively.

Table 6

| Composition | Resistance to printing | Resistance to moisture | Resolution | Dissolubility |
|---|---|---|---|---|
| A | 21,000 | 39 | 0.1 | 3 |
| B | 20,000 | 38 | 0.1 | 2.5 |
| C | 19,000 | 37 | 0.15 | 5 |
| D | 20,000 | 37 | 0.15 | 4 |
| E | 20,000 | 35 | 0.15 | 4 |

EXAMPLE 9

The process was repeated using the procedure and reagents employed in Example 1 except that the diazo compound used therein was replaced by the following diazo compound to give a photosensitive compound which was, in turn, used, according to the process of Example 3, to prepare a printing screen.

The test results are presented in Table 7. In the following table, Composition "A" uses p-aminodiphenylamine and propionaldehyde, Composition "B" p-aminodiphenylamine and acetaldehyde, Composition "C" 4-amino-4'-methyldiphenylamine and paraformaldehyde, Composition "D" 4-amino-4'-methoxydiphenylamine and paraformaldehyde, Composition "E" 3,3'-dichlorodiphenyl-4,4'-tetrazo compound, and Composition "F" 3,3'-dimethoxydiphenyl-4,4'tetrazo compound. By exposure time herein referred to is meant a period of time expressed in minutes needed for obtaining an optimum effect.

Table 7

| Composition | Exposure time | Resistance to printing | Resistance to moisture | Resolution | Dissolubility |
|---|---|---|---|---|---|
| A | 5 | 21,000 | 46 | 0.1–0.15 | 2 |
| B | 5 | 21,500 | 45 | 0.1–0.15 | 2 |
| C | 5 | 21,000 | 48 | 0.1–0.15 | 2 |
| D | 5 | 21,000 | 47 | 0.1–0.15 | 2 |
| E | 7 | 20,000 | 52 | 0.15 | 2 |
| F | 7 | 20,000 | 52 | 0.15 | 2 |

EXAMPLE 10

By following the process of Example 1 and replacing the weight ratio of the water-soluble graft copolymer to the polymeric emulsion to the polycondensate employed therein by the following weight ratio as presented in Table 8, the photosensitive composition was prepared in the same manner as in Example 3. The resulting composition was then used to prepare a printing screen.

The test results are shown in Table 8. In the following table, Composition "A" contains the weight ratio of 45:45:1.8, Composition "B" 45:45:2.7, Composition "C" 45:22.5:0.9, Composition "D" 45:90:0.9, and Composition "E" the composition of Example 1.

Table 8

| Composition | Resistance to printing | Resistance to moisture | Resolution | Dissolubility |
|---|---|---|---|---|
| A | 23,000 | 35 | 0.1 | 3.5 |
| B | 23,500 | 30 | 0.1 | 4.5 |
| C | 24,000 | 48 | 0.1 | 1.0 |
| D | 18,000 | 33 | 0.1–0.15 | 10.0 |
| E | 21,000 | 45 | 0.1 | 2.0 |

EXAMPLE 11

The process was repeated using the procedure and the reagents employed in Example 1 except that 0.001 part by weight of the following reagent was added to the composition of Example 1.

The test results are shown in Table 9 in which Composition "A" uses octyl alcohol, Composition "B" a silicone resin, and Composition "C" tributyl phosphate, and the composition of Example 1 was employed as a control in item "D". The test value is an index when the pores of composition D is taken as 100.

Table 9

| Composition | Pores per sq. cm. |
|---|---|
| A | 10 |
| B | 12 |
| C | 10 |
| D | 100 |

EXAMPLE 12

The photosensitive composition under test was prepared by following the process of Example 1 and adding to the composition of Example 1 silicon dioxide ("Aerosil" registered trade mark of Nippon Aerosil Co., Ltd.) having an average particle size of 7 microns in an amount as presented below. With this composition, a printing screen was prepared in the same manner as in Example 3.

The test results are shown in Table 10 in which Composition "A" uses 0.6 part by weight of silicon dioxide and "B" 1.0 part by weight, and "C" is the composition of Example 1.

Table 10

| Composition | Resistance to printing | Resistance to moisture | Resolution |
|---|---|---|---|
| A | 22,000 | 42 | 0.1 |
| B | 21,000 | 43 | 0.1 |
| C | 22,000 | 45 | 0.1 |

What we claim is:

1. A photosensitive composition for the formation of a photosensitive film in a water-dissoluble printing screen, comprising the admixture of:
   (a) at least one water-soluble graft copolymer, the graft copolymer being prepared by the graft polymerization of acrylonitrile, or acrylonitrile with at least one vinylic monomer selected from the group consisting of acrylic esters, methacrylic ester, vinylic unsaturated nitrile and vinylic amide in a ratio of from 5 to 50 parts by weight of the vinylic monomer to 100 parts by weight of acrylonitrile, onto a partially hydrolyzed polyvinyl acetate having a degree of polymerization of from 300 to 1,200 and a degree of hydrolyzation of 80 to 90 mol percent, the proportion of acrylonitrile or acrylonitrile and vinylic monomer being from 30 to 120 parts by weight to 100 parts by weight of the partially hydrolized polyvinyl acetate;
   (b) at least one-film forming polymeric emulsion selected from the group consisting of vinyl acetate resinous emulsion, ethylene-vinyl acetate copolymeric resinous emulsion, methacrylate-vinyl acetate copolymeric resinous emulsion, styrene-butadiene copolymeric resious emulsion, methacrylate-butadiene copolymeric resinous emulsions, butyl rubber latex and vinyl chloride-vinyl acetate copolymeric resinous emulsion; and
   (c) at least one water-soluble diazonium compound having at least two diazonium groups;
   the proportion of the graft copolymer to the polymeric emulsions being from 30:100 to 100:30 parts by weight and the proportion of the diazonium compound to the total solids in the composition being from 1:100 to 10:100 parts by weight.

2. The photosensitive composition according to claim 1, wherein the acrylic ester is an alkyl acrylate.

3. The photosensitive composition according to claim 2, wherein the alkyl acrylate is methyl or ethyl acrylate.

4. The photosensitive composition according to claim 1, wherein the methacrylic ester is an alkyl methacrylate or glycidyl methacrylate.

5. The photosensitive composition according to claim 4, wherein the alkyl methacrylate is methyl or ethyl methacrylate.

6. The photosensitive composition according to claim 1, wherein the vinylic unsaturated nitrile is methacrylonitrile.

7. The photosensitive composition according to claim 1, wherein the vinylic amide is acrylamide.

8. The photosensitive composition according to claim 1, wherein the graft copolymer which is used is prepared by photo-polymerization in the presence of diacetyl.

9. The photosensitive composition according to claim 1, wherein the graft copolymer is used which is prepared by polymerization in the presence of ammonium persulfate by applying heat thereto.

10. The photosensitive composition according to claim 1, wherein the graft copolymer contains dry solids in an amount of 20 to 30 percent.

11. The photosensitive composition according to claim 1, wherein the polymeric emulsion contains dry solids in an amount of about 40 to 60 percent.

12. The photosensitive composition according to claim 1, wherein the acrylic or methacrylic ester is in the form of an ester with an aliphatic, straight or branched chained, alkyl group.

13. The photosensitive composition according to claim 12, wherein the aliphatic alkyl group is a member selected from the group consisting of methyl, etheyl, n-butyl, 2-ethylhexyl, n-tetradecyl and n-hexadecyl.

14. The photosensitive composition according to claim 1, wherein the diazonium compound is selected from the group consisting of a diazonium salt of bisphenol ester resin, a diazonium acrylamide resin, a tetrazo compound or a diazodiphenylamine where the dephenyl amine is unsubstituted or substituted by an alkyl group, an alkoxy group or a halogen atom.

15. The photosensitive composition according to claim 14, wherein the diphenylamine is a member or a combination of members selected from the group consisting of 4-amino-4'-methyldiphenylamine, 4-amino-4'-ethyldiphenylamine, 4-amino-4'-methoxyphenylamine and 4-amino-4'-chlorodiphenylamine.

16. The photosensitive composition according to claim 14, wherein the tetrazo compound is a member or a combination of members selected from the group consisting of diphenyl-4,4'-tetrazonium chloride zinc chloride double salt, 3,3'-dichlorodiphenyl-4,4'-tetrazonium chloride zinc chloride double salt, 3,3'-dimethoxydiphenyl-4,4'-tetrazonium chloride zinc chloride double salt, 3,3'-dimethyldiphenyl-4,4'-tetrazonium chloride zinc chloride double salt, 3,3'-diethyldiphenyl-4,4'-tetrazonium chloride zinc chloride double salt, 3,3'-dimethoxydiphenyl-4,4'-tetrazonium sulfate, 3,3'-dimethyldiphenyl-4,4'-tetrazonium sulfate and 3,3'-diethyldiphenyl-4,4'-tetrazonium sulfate.

17. The photosensitive composition according to claim 1, wherein an additive is added.

18. The photosensitive composition according to claim 17, wherein the additive is a defoaming agent.

19. The photosensitive composition according to claim 18, wherein the defoaming agent is a member selected from the group consisting of octyl alcohol, a silicone resin and tributyl phosphate.

20. The photosensitive composition according to claim 18, wherein the defoaming agent is used in an amount of 0.01 to 1.0 part by weight with respect to a mixture of the water-soluble polymeric material and the polymeric emulsion.

21. The photosensitive composition according to claim 17, wherein the additive is a water-insoluble powder which can show a transparency of 50 to 90 percent when it is present in the composition.

22. The photosensitive composition according to claim 21, wherein the water-insoluble powder is a member selected from the group consisting of an amorphous silicon dioxide and white carbon having an average particle size of 0.1 to 20 microns.

23. The photosensitive composition according to claim 2, wherein the water-insoluble powder is employed in an amount of 1.0 to 10.0 parts by weight with respect to 1,000 parts by weight of a mixture of the water-soluble polymeric material and the polymeric emulsion.

24. The photosensitive composition according to claim 17, wherein the additive is a water-soluble dyestuff.

25. The photosensitive composition according to claim 24, wherein the dyestuff is a member or a combination of members selected from the group consisting of C. I. basic violet, C. I. based Red 12, C. I. basic blue 1, C. I. acid green 36, C. I. acid blue 40 and C. I. acid red 249.

26. The photosensitive composition according to claim 24, wherein the dyestuff is employed in an amount of 0.1 to 1.0 part by weight per 1,000 parts by weight of a mixture of the water-soluble graft copolymer and the polymeric emulsion.

27. A water-dissoluble printing screen which is prepared by employing the photosensitive composition of claim 17.

28. A water-dissoluble printing screen which is prepared by employing the photosensitive composition of claim 1.

29. The printing screen according to claim 27, wherein the photosensitive composition is coated on a silk, polyester or steel wire screen.

30. The printing screen according to claim 27, wherein a coating of the photosensitive composition has a thickness of 60 to 200 microns.

* * * * *